(12) United States Patent
Shen

(10) Patent No.: US 9,807,546 B2
(45) Date of Patent: Oct. 31, 2017

(54) MAGNETIC CONTROLLED BLUETOOTH DEVICE

(71) Applicant: AIROHA TECHNOLOGY CORP., Hsinchu (TW)

(72) Inventor: Yen-Chih Shen, Hsinchu (TW)

(73) Assignee: Airoha Technology Corp., Hsinchu (TW)

( * ) Notice: Subject to any disclaimer, the term of this patent is extended or adjusted under 35 U.S.C. 154(b) by 0 days.

(21) Appl. No.: 14/957,818

(22) Filed: Dec. 3, 2015

(65) Prior Publication Data

US 2016/0205497 A1 Jul. 14, 2016

Related U.S. Application Data

(60) Provisional application No. 62/101,490, filed on Jan. 9, 2015.

(51) Int. Cl.
*H04W 4/00* (2009.01)
*G01R 33/07* (2006.01)
*G01R 33/038* (2006.01)

(52) U.S. Cl.
CPC ........ *H04W 4/008* (2013.01); *G01R 33/0385* (2013.01); *G01R 33/07* (2013.01)

(58) Field of Classification Search
CPC ... H04W 4/008; G01R 33/0385; G01R 33/07; H04B 2201/71346; H04M 2017/2531; H04M 17/305; H04M 2201/08
See application file for complete search history.

(56) References Cited

U.S. PATENT DOCUMENTS

| | | | |
|---|---|---|---|
| 8,913,955 B1* | 12/2014 | Mincher | H04B 5/0075 455/41.1 |
| 2007/0057662 A1* | 3/2007 | Yakymyshyn | G01R 15/207 324/117 R |
| 2011/0070834 A1 | 3/2011 | Griffin et al. | |
| 2016/0012695 A1* | 1/2016 | Bell | G08B 13/2402 340/572.1 |

FOREIGN PATENT DOCUMENTS

| CN | 102137185 B | 11/2013 |
|---|---|---|
| CN | 103648158 A | 3/2014 |

* cited by examiner

*Primary Examiner* — Andrew Wendell
(74) *Attorney, Agent, or Firm* — Rosenberg, Klein & Lee

(57) ABSTRACT

The present invention relates to a magnetic controlled Bluetooth device and more particularly to a magnetic controlled Bluetooth speaker. The magnetic controlled Bluetooth device comprises a magnetic unit and a magnetic sensor. As another magnetic unit approaches the magnetic sensor of the magnetic controlled Bluetooth device, the magnetic sensor varies its output voltage in response to the magnetic field of another magnet. Thus, the magnetic controlled Bluetooth device can be turned on to execute a Bluetooth pairing process. Further, the magnetic unit of the magnetic controlled Bluetooth device can be used to approaches another magnetic sensor of another magnetic controlled Bluetooth device to turn on another magnetic controlled Bluetooth device.

2 Claims, 6 Drawing Sheets

MAGNETIC CONTROLLED BLUETOOTH DEVICE

REFERENCE TO RELATED APPLICATIONS

This application is based on Provisional application Ser. No. 62/101,490, filed Jan. 9, 2015, currently pending.

FIELD OF THE INVENTION

The present invention relates to a magnetic controlled Bluetooth device that is able to be turned on to execute a Bluetooth pairing process by a magnetic unit.

BACKGROUND

Bluetooth is a kind of wireless technology standard for exchanging data over short distances, and is used on common electronic devices. Two or more electronic devices are able to transmit data or multimedia data via Bluetooth to improve convenience of use.

FIG. 1 is a block diagram of a common Bluetooth device. A first Bluetooth device 11 comprises a first control unit 111 and a first NFC unit (Near Field Communication unit) 113, and a second Bluetooth device 13 comprises a second control unit 131 and a second NFC unit 133.

When the first Bluetooth device 11 approaches the second Bluetooth device 13, the first NFC unit 113 and the second NFC 133 sense each other, and transmit signal to the first control unit 111 and the second control unit 131 respectively. Then, the first control unit 111 and the second control unit 131 are able to turn on the first Bluetooth device 11 and the second Bluetooth device 13 respectively to execute a Bluetooth pairing process. Thereafter, the first Bluetooth device 11 and second Bluetooth device 13 are able to transmit data via Bluetooth each other.

Accordingly, two Bluetooth devices 11/13 are able to execute the Bluetooth pairing process by closing two Bluetooth devices 11/13 to each other to improve convenience of using Bluetooth device. However, the production cost and size of the Bluetooth devices 11/13 will be increased, when the NFC unit 113/133 is provided within the Bluetooth device 11/13.

SUMMARY

It is one object of the present invention to provide a magnetic controlled Bluetooth device that comprises a magnetic unit, a magnetic sensor and a control unit. When a magnetic force activing on the magnetic sensor increases, the magnetic sensor transmits a triggering signal to the control unit to turn on the magnetic controlled Bluetooth device to execute the Bluetooth pairing process. Thus, it is unnecessary to install NFC (Near Field Communication) on the magnetic controlled Bluetooth device to reduce the production costs and size of the magnetic controlled Bluetooth device.

It is one object of the present invention to provide a magnetic controlled Bluetooth device. There are two or more than two magnetic controlled Bluetooth devices, and each of magnetic controlled Bluetooth devices comprises a magnetic unit and a magnetic sensor located on the surface thereof. As the magnetic unit and the magnetic sensor of one magnetic controlled Bluetooth device closes to the magnetic sensor and the magnetic unit of another magnetic controlled Bluetooth device, each magnetic sensor will sense the magnetic force to turn on and trigger those two adjacent magnetic controlled Bluetooth devices to execute the Bluetooth pairing process.

For achieving above objects, the present invention provides a magnetic controlled Bluetooth device, comprising: a magnetic unit; a magnetic sensor configured to sense a magnetic force to generate a triggering signal; and a control unit electronically connected to the magnetic sensor, wherein the control unit is configured to turn on the magnetic controlled Bluetooth device to execute a Bluetooth pairing process, as the control unit receives the triggering signal from the magnetic sensor.

The present invention provides another magnetic controlled Bluetooth device, comprising: a first magnetic controlled Bluetooth device, comprising: a first magnetic unit; a first magnetic sensor configured to sense a first magnetic force to generate a first triggering signal; a first control unit electronically connected to the first magnetic sensor, wherein the first control unit is configured to turn on the first magnetic controlled Bluetooth device to execute a Bluetooth pairing process, as the first control unit receives the first triggering signal from the first magnetic sensor; and a second magnetic controlled Bluetooth device, comprising: a second magnetic unit; a second magnetic sensor configured to sense a second magnetic force to generate a second triggering signal; a second control unit electronically connected to the second magnetic sensor, wherein the second control unit is configured to turn on the second magnetic controlled Bluetooth device to execute the Bluetooth pairing process, as the second control unit receives the second triggering signal from the second magnetic sensor.

BRIEF DESCRIPTION OF THE DRAWINGS

The structure as well as preferred modes of use, further objects, and advantages of this invention will be best understood by referring to the following detailed description of some illustrative embodiments in conjunction with the accompanying drawings, in which.

DETAILED DESCRIPTION OF THE PREFERRED EMBODIMENTS

Figure 1:
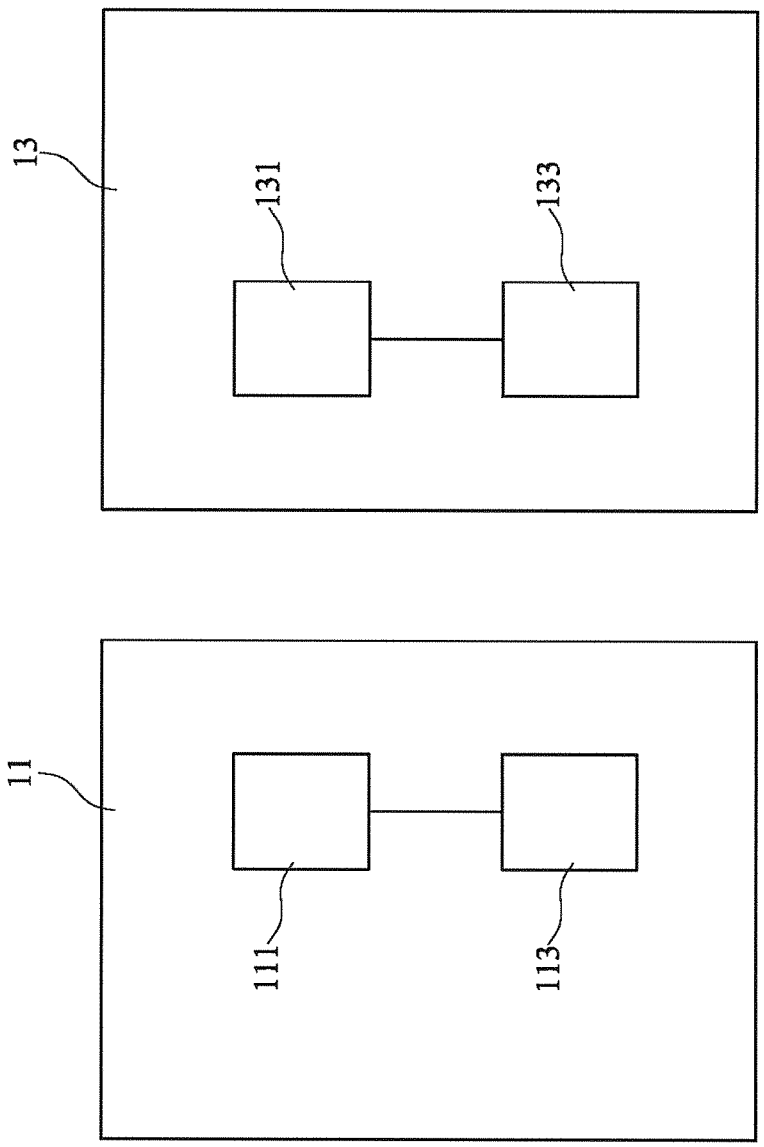
FIG. 1 is a block diagram of a common Bluetooth device.
Figure 2:
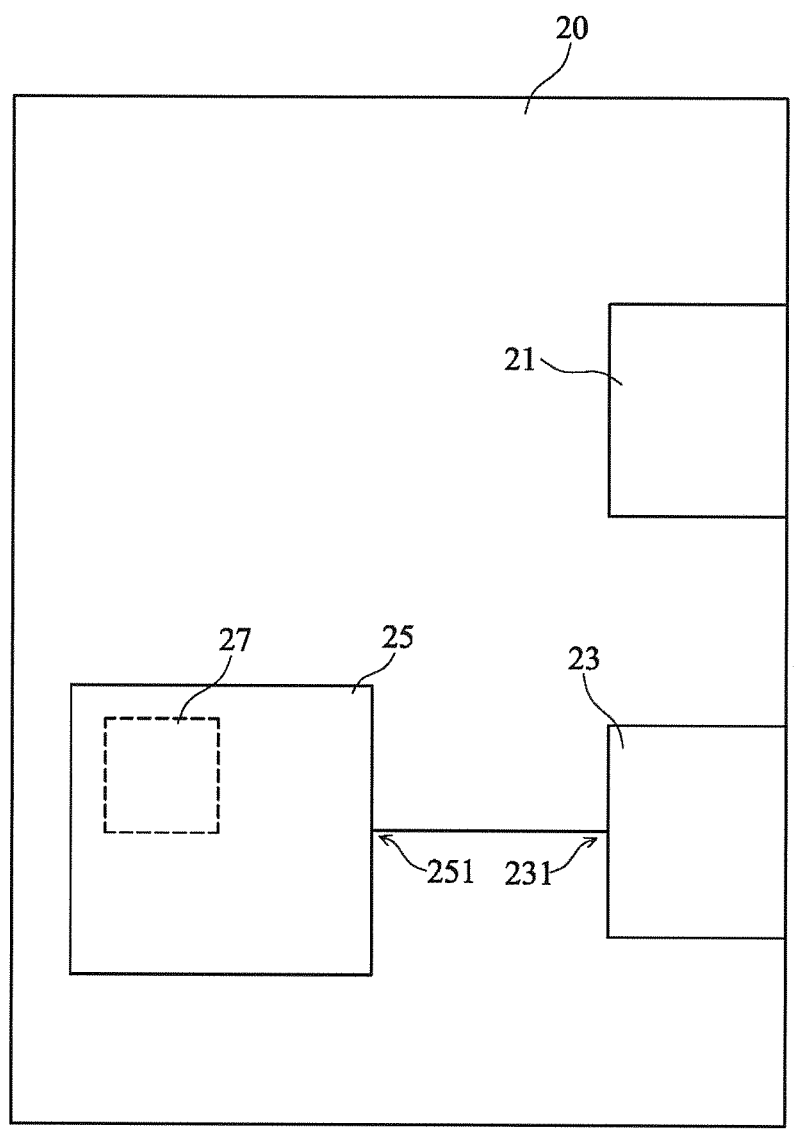
FIG. 2 is a connection diagram of a magnetic controlled Bluetooth device according to a first embodiment of the present invention.

FIG. 2 is a connection diagram of a magnetic controlled Bluetooth device according to a first embodiment of the present invention. The magnetic controlled Bluetooth device 20 comprises a magnetic unit 21, a magnetic sensor 23 and a control unit 25. The magnetic sensor 23 is electronically connected to the control unit 25. For instance, an output end 231 of the magnetic sensor 23 is connected to a sensing end 251 of the control unit 25.

In one embodiment of the invention, the magnetic unit 21 is a device for generating a magnetic force, such as magnet. The magnetic sensor 23 is able to sense the magnetic force, the magnetic field or a change in the magnetic force or the magnetic field to generate a triggering signal. For instance, the magnetic sensor 23 may be a Hall sensor that varies its output voltage in response to the magnetic field. Off course, the Hall sensor is not limitation of the invention.

When the magnetic force activing on the magnetic sensor 23 is changed, the output voltage or output current of the magnetic sensor 23 will change accordingly. For instance, when another magnetic unit approaches the magnetic sensor 23, the magnetic force or magnetic field activing on the magnetic sensor 23 increases, and then the voltage or current on the output end 231 of the magnetic sensor 23 will increase. The magnetic sensor 23 may be a Hall sensor, and the voltage on the output end 231 of the magnetic sensor 23 increases as the magnetic force or the magnetic field increases thereon. Then, the output end 231 of the magnetic sensor 23 transmits a triggering signal to the sensing end 251 of the control unit 25.

In generally, the triggering signal may be a pulse signal or a negative pulse signal, such as a square wave. The period of the triggering signal is related to time of the magnetic force or the magnetic field activing on the magnetic sensor 23. For instance, as time of another magnetic unit closing to the magnetic sensor 23 increases, the period of the triggering signal generated by the magnetic sensor 23 will increase. Further, the amplitude or intensity of the triggering signal is related to the magnetic force or magnetic field activing on the magnetic sensor 23. For instance, when the distance between another magnetic unit and the magnetic sensor 23 is reduced, the amplitude of the trigger signal generated by the magnetic sensor 23 will increase.

In one embodiment of the invention, the control unit 25 can be set to be turned on, when the period and/or the amplitude of the triggering signal is larger than a preset value. Thus, when the distance between another magnetic unit and the magnetic sensor 23 is smaller than a preset distance, and the time of another magnetic unit closing to the magnetic sensor 23 is greater than a preset time, the triggering signal generated by the magnetic sensor 23 is able to trigger the control unit 25 to turn on the magnetic controlled Bluetooth device 20 to execute a Bluetooth pairing process. Accordingly, magnetic controlled Bluetooth device 20 will not be carelessly turned on by the user to reduce power consumption.

When the control unit 25 receives the triggering signal from the magnetic sensor 23, it turns on the magnetic controlled Bluetooth device 20 to execute the Bluetooth pairing process. Thus, the user is able to turn on the magnetic controlled Bluetooth device 20 to execute the Bluetooth pairing process by approaching another magnetic unit and the magnetic controlled Bluetooth device 20. Thereafter, the step or method of turning on the magnetic controlled Bluetooth device 20 can be simplified, and it is unnecessary to install NFC (Near Field Communication) or power switch on the magnetic controlled Bluetooth device 20 to reduce the production costs and size and increase serviceability thereof.

In another embodiment of the invention, the control unit 25 of the magnetic controlled Bluetooth device 20 may comprise a Bluetooth chip 27, and the control unit 25 is able to turn on and/or control the Bluetooth chip 27. The control unit 25 is able to turn on the Bluetooth chip 27 and control the Bluetooth chip 27 executing the Bluetooth pairing process, after receiving the triggering signal from the magnetic sensor 23. Further, the Bluetooth chip 27 may be integrated within the control unit 25, or the Bluetooth chip 27 and the control unit 25 may be two different devices.

Figure 3:
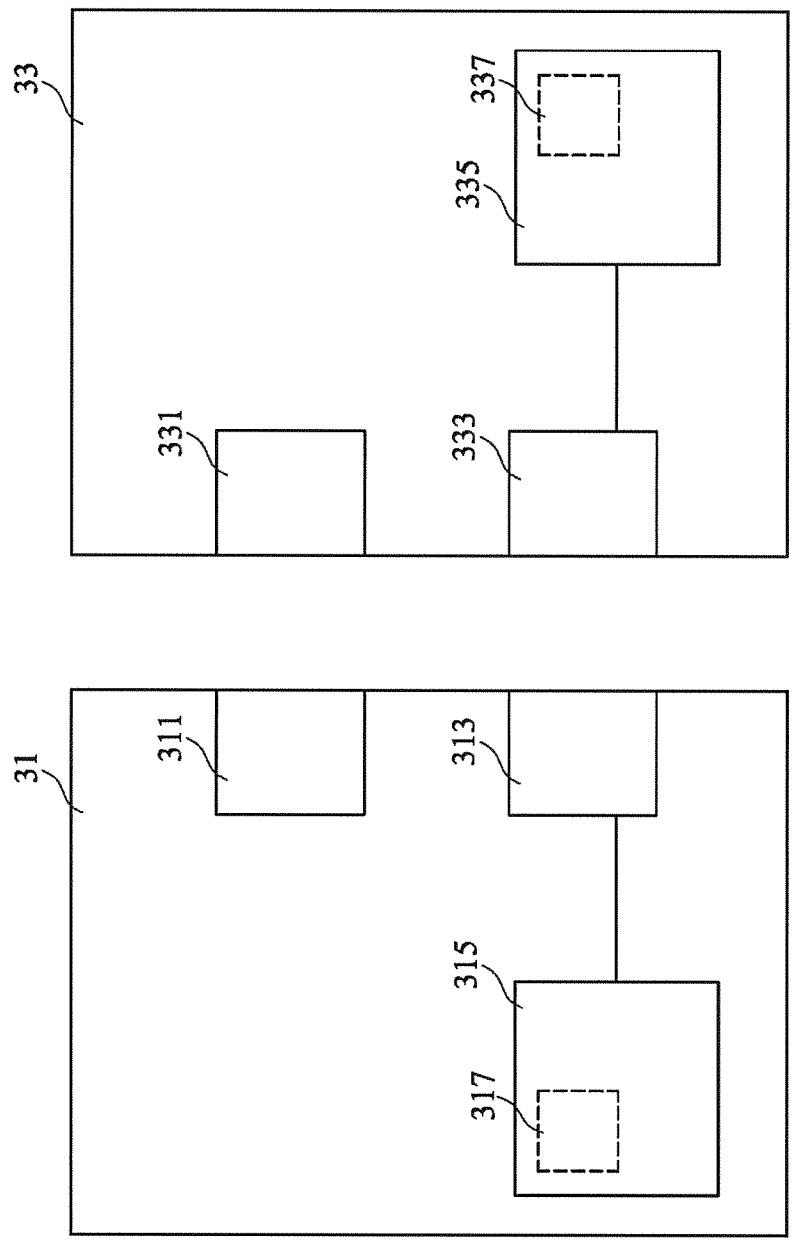
FIG. 3 is a connection diagram of a magnetic controlled Bluetooth device according to a second embodiment of the present invention.

FIG. 3 is a connection diagram of a magnetic controlled Bluetooth device according to a second embodiment of the present invention. In this embodiment of the invention, there are two magnetic controlled Bluetooth devices. However, the number of the magnetic controlled Bluetooth device is not limitation of the invention, and the number of the magnetic controlled Bluetooth device may be greater than two.

In this embodiment of the invention, there are a first magnetic controlled Bluetooth device 31 and a second magnetic controlled Bluetooth device 33, and the structure of the first and the second magnetic controlled Bluetooth devices 31/33 are similar to the magnetic controlled Bluetooth device 20 of the first embodiment of the invention. The first magnetic controlled Bluetooth device 31 comprises a first magnetic unit 311, a first magnetic sensor 313 and a first control unit 315, and the first magnetic sensor 313 is electrically connected to the first control unit 315. Further, the second magnetic controlled Bluetooth device 33 comprises a second magnetic unit 331, a second magnetic sensor 333 and a second control unit 335, and the second magnetic sensor 333 is electrically connected to the second control unit 335.

The user is able to approach the first and second magnetic controlled Bluetooth devices 31/33 each other to establish the Bluetooth connection therebetween. For instance, the first magnetic unit 311 of the first magnetic controlled Bluetooth device 31 approaches the second magnetic sensor 333 of the second magnetic controlled Bluetooth device 33, and the second magnetic unit 331 of the second magnetic controlled Bluetooth device 33 approaches the first magnetic sensor 313 of the first magnetic controlled Bluetooth device 31.

The second magnetic unit 331 of the second magnetic controlled Bluetooth device 33 approaches the first magnetic sensor 313 of the first magnetic controlled Bluetooth device 31 to increase magnetic force activing on the first magnetic sensor 313, and then the first magnetic sensor 313 generates and transmits a first triggering signal to the first control unit 315. Thereafter, the first control unit 315 turns on the first magnetic controlled Bluetooth device 31 to execute the Bluetooth pairing process after receiving the first triggering signal from the first magnetic sensor 313. Further, the first magnetic unit 311 of the first magnetic controlled Bluetooth device 31 approaches the second magnetic sensor 333 of the second magnetic controlled Bluetooth device 33 to increase magnetic force activing on the second magnetic sensor 333, and then the second magnetic sensor 333 generates and transmits a second triggering signal to the second control unit 335. The second control unit 335 turns on the second magnetic controlled Bluetooth device 33 to execute the Bluetooth pairing process after receiving the second triggering signal from the second magnetic sensor 333.

Accordingly, the user is able to turn on the first and second magnetic controlled Bluetooth devices 31/33 to execute the Bluetooth pairing process by closing the first magnetic unit 311 and the first magnetic sensor 313 of the first magnetic controlled Bluetooth device 31 to the second magnetic sensor 333 and the second magnetic unit 331 of the second magnetic controlled Bluetooth device 33 respectively.

In another embodiment of the invention, the first control unit 315 of the first magnetic controlled Bluetooth device 31 further comprises a first Bluetooth chip 317. The first control unit 315 turns on the first Bluetooth chip 317 after receiving the triggering signal from the first magnetic sensor 313.

Further, the second control unit 335 of the second magnetic controlled Bluetooth device 33 comprises a second Bluetooth chip 337. The second control unit 335 turns on the second Bluetooth chip 337 after receiving the triggering signal from the second magnetic sensor 333. Thereafter, the first and second magnetic controlled Bluetooth devices 31/33 are able to execute Bluetooth pairing process and then transmit data via Bluetooth. In this embodiment of the invention, the first control unit 315 and the first Bluetooth chip 317 are integrated into a single chip, and the second control 335 and the second Bluetooth chip 337 are integrated into a single chip. In other embodiment of the invention, the first control unit 315 and the first Bluetooth chip 317 may be two different devices, and the second control unit 335 and the second Bluetooth chip 337 may be two different devices.

Figure 4:
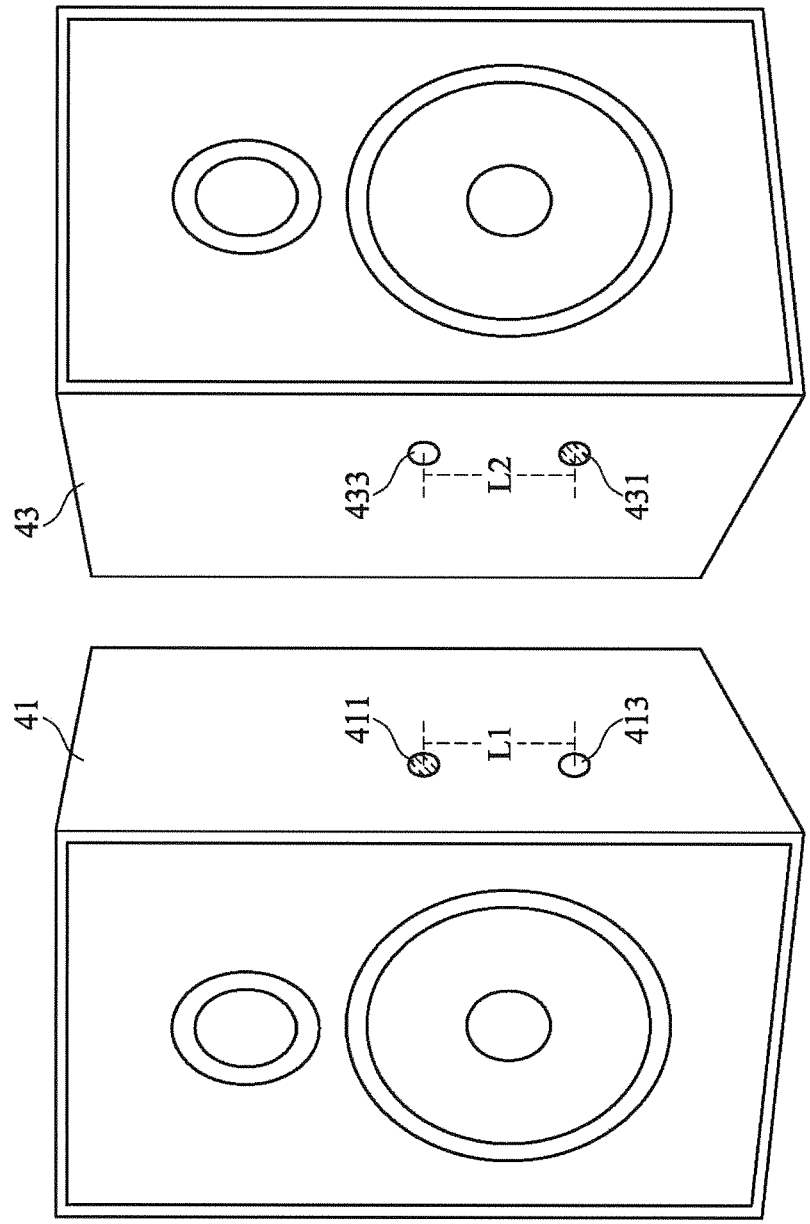
FIG. 4 is a connection diagram of a magnetic controlled Bluetooth device according to a third embodiment of the present invention.

In third embodiment of the invention, the first and second magnetic controlled Bluetooth devices 31/33 are Bluetooth speakers or Bluetooth headsets, as shown in FIG. 4. The first magnetic controlled Bluetooth speaker 41 comprises a first magnetic unit 411 and a first magnetic sensor 413 that are disposed on or near the surface of the first magnetic controlled Bluetooth speaker 41. The second magnetic controlled Bluetooth speaker 43 comprises a second magnetic unit 431 and a second magnetic sensor 433 that are disposed on or near the surface of the second magnetic controlled Bluetooth speaker 43.

In one embodiment of the invention, the distance between the first magnetic unit 411 and the first magnetic sensor 413 of the first magnetic controlled Bluetooth speaker 41 is a first distance L1, and the distance between the second magnetic unit 431 and the second magnetic sensor 433 of the second magnetic controlled Bluetooth speaker 43 is a second distance L2. Further, the first distance L1 is similar to the second distance L2. When the first magnetic unit 411 approaches the second magnetic sensor 433, the second magnetic unit 431 approaches to the first magnetic sensor 413 too. Thus, the first and second magnetic controlled Bluetooth speakers 41/43 are able to be turned on to execute Bluetooth pairing process therebetween at the same time.

In one embodiment of the invention, the first magnetic unit 411 is located above the first magnetic sensor 413, and the second magnetic unit 431 is located under the second magnetic sensor 433. However, the position of the first magnetic unit 411, the first magnetic sensor 413, the second magnetic unit 431 and the second magnetic sensor 433 is not limitation of the invention. For instance, the first magnetic unit 411 may be located right side or left side of the first magnetic sensor 413, and the second magnetic unit 431 may be located right side or left side of the second magnetic sensor 433. The main feature of this embodiment is the first distance L1 is similar to the second distance L2. Thus, the first and second magnetic controlled Bluetooth speakers 41/43 are able to be turned on and establish Bluetooth connection therebetween by approaching each other.

In one embodiment of the invention, the first magnetic controlled Bluetooth speaker 41 may be a Master, and the second magnetic controlled Bluetooth speaker 43 may be a Slave. The first magnetic controlled Bluetooth speaker 41 is able to transmit streaming packets to the second magnetic controlled Bluetooth speaker 43. Further, the first and second magnetic controlled Bluetooth speakers 41/43 are able to play audio signal synchronously.

Figure 5:
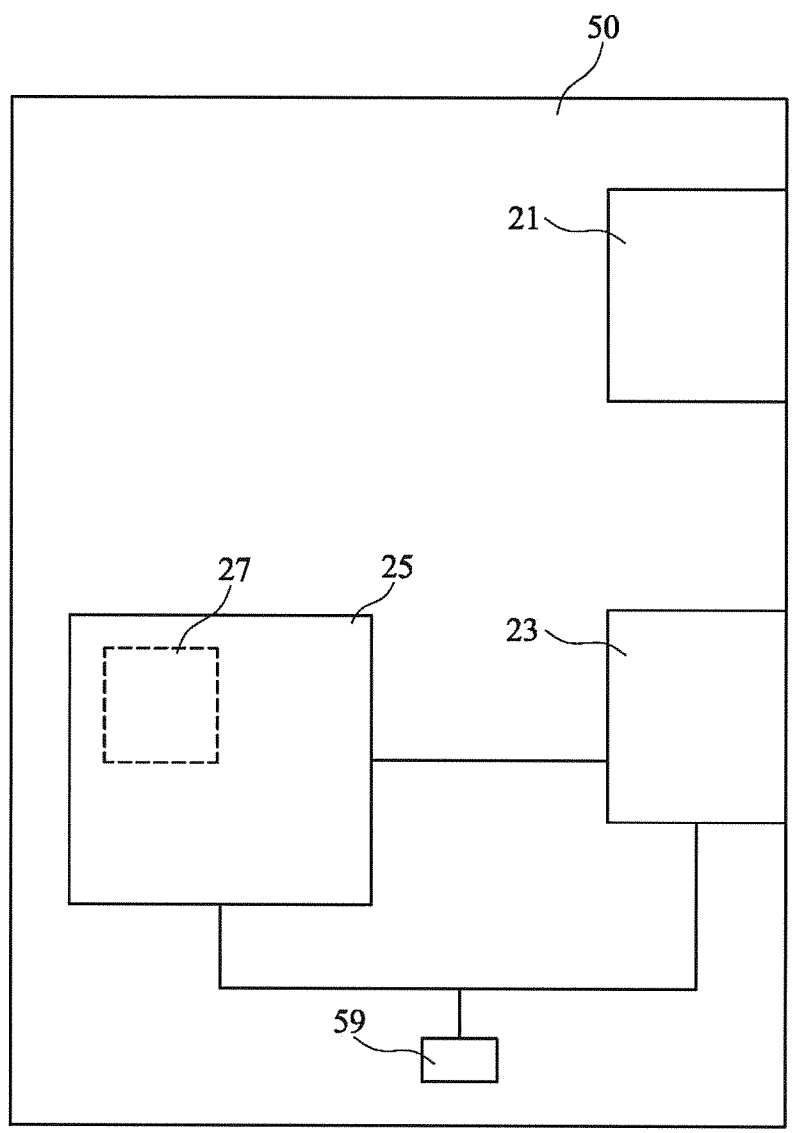
FIG. 5 is a connection diagram of a magnetic controlled Bluetooth device according to a fourth embodiment of the present invention.

FIG. 5 is a connection diagram of a magnetic controlled Bluetooth device according to a fourth embodiment of the present invention. The magnetic controlled Bluetooth device 50 comprises a magnetic unit 21, a magnetic sensor 23, a control unit 25, a Bluetooth chip 27 and a power supply unit 59. The control unit 25 is electronically connected to the magnetic sensor 23 and comprises the Bluetooth chip 27.

The structure of the magnetic controlled Bluetooth device 50 of the embodiment is similar to the magnetic controlled Bluetooth device 20 of the first embodiment. The difference between those two magnetic controlled Bluetooth devices 20/50 is the magnetic controlled Bluetooth device 50 further comprising the power supply unit 59. The power supply unit 59 is electronically connected to the magnetic sensor 23 and the control unit 25. When the magnetic controlled Bluetooth device 50 is in off state or standby state, the power supply unit 59 only supplies low voltage power to the magnetic sensor 23 for sensing change of the magnetic force thereon to reduce power consumption of the magnetic controlled Bluetooth device 50.

Figure 6:
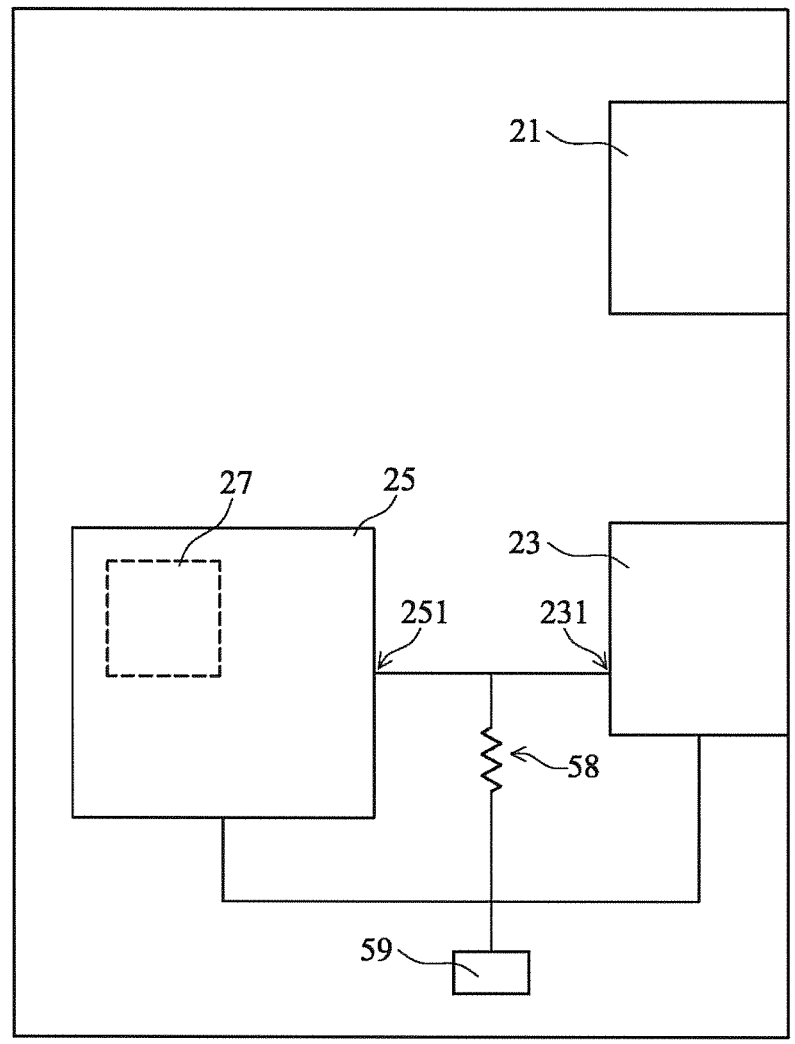
FIG. 6 is a connection diagram of a magnetic controlled Bluetooth device according to a fifth embodiment of the present invention.

FIG. 6 is a fifth embodiment of the invention, and the power supply unit 59 is electronically connected and supplies power to the magnetic sensor 23 and the control unit 25. Furthermore, the power supply unit 59 is also electronically connected to the magnetic sensor 23 and the control unit 25 via at least one impedance unit 58. For instance, the output end 231 of the magnetic sensor 23 is electronically connected to the sensing end 251 of the control unit 25, and the power supply unit 59 is electronically to the output end 231 of the magnetic sensor 23 and the sensing end 251 of the control unit 25 via the impedance unit 58. When the magnetic force activing on the magnetic sensor 23 increases, the output end 231 of the magnetic sensor 23 transmits a negative pulse signal to the sensing end 251 of the control unit 25 to trigger the control unit 25 to turn on the magnetic controlled Bluetooth device 50.

In other embodiment of the invention, the number of the magnetic controlled Bluetooth device 50 may be more than two as the second or the third embodiment of the invention.

The above disclosure is only the preferred embodiment of the present invention, and not used for limiting the scope of the present invention. All equivalent variations and modifications on the basis of shapes, structures, features and spirits described in claims of the present invention should be included in the claims of the present invention.

What is claimed is:

1. A magnetic controlled Bluetooth device, comprising:
   a magnetic unit;
   a magnetic sensor configured to sense a magnetic force to generate a triggering signal;
   a control unit electronically connected to said magnetic sensor, said control unit including a Bluetooth chip, wherein said control unit is configured to turn on said Bluetooth chip to execute a Bluetooth pairing process, as said control unit receives said triggering signal from said magnetic sensor, wherein said magnetic sensor comprises an output end, said control unit comprises a sensing end, and said output end of said magnetic sensor is connected to said sensing end of said control unit; and
   at least one power supply unit connected to said control unit and said magnetic sensor, wherein said power supply unit is electronically connected to said output end of said magnetic sensor and said sensing end of said control unit via at least one impedance unit connected in series from said power supply unit to said magnetic sensor and said control unit; and electrically connected to said control unit and said magnetic sensor to supply a voltage power to said magnetic sensor and said control unit.

2. The magnetic controlled Bluetooth device according to claim 1, wherein said magnetic sensor is a Hall sensor.

\* \* \* \* \*